United States Patent [19]
Lee et al.

[11] Patent Number: 5,923,606
[45] Date of Patent: Jul. 13, 1999

[54] NOR-TYPE MASK ROM HAVING DUAL SENSE CURRENT PATHS

[75] Inventors: Woon-Kyung Lee, Seoul; Eui-Do Kim, Daegukwangyeok, both of Rep. of Korea

[73] Assignee: SAmsung Electronics, Co., Ltd., Suwon-city, Rep. of Korea

[21] Appl. No.: 08/954,905

[22] Filed: Oct. 21, 1997

[30] Foreign Application Priority Data

Oct. 21, 1996 [KR] Rep. of Korea ................. 96/47191

[51] Int. Cl.⁶ ................................................. G11C 13/00

[52] U.S. Cl. ......................... 365/230.03; 365/189.03

[58] Field of Search ........................... 365/51, 230.01, 365/230.03, 189.01, 189.03

[56] References Cited

U.S. PATENT DOCUMENTS 5,499,216  3/1996  Yamamoto ................. 365/189.01

*Primary Examiner*—Terrell W. Fears
*Attorney, Agent, or Firm*—Marger Johnson & McCollom, P.C.

[57] ABSTRACT

A NOR-type mask ROM reduces the resistance ratio of buried diffusion layers and improves the drive capacity of bank selection transistors by utilizing sub-bit line selection transistors located near the center of a memory cell array. The sub-bit line selection transistors are connected to a pair of sub-bank selection lines that divide the memory cell array into symmetric upper and lower portions. The bank selection transistors couple alternate sub-bit lines to main bit lines at both ends of the sub-bit lines, thereby forming a dual current path between the main bit lines and the memory cells coupled to the sub-bit lines.

20 Claims, 6 Drawing Sheets

NOR-TYPE MASK ROM HAVING DUAL SENSE CURRENT PATHS

This application corresponds to Korean patent application No. 47191/1996 filed Oct. 21, 1996 in the name of Samsung Electronics Co., Ltd., which is herein incorporated by reference for all purposes.

BACKGROUND OF THE INVENTION

1. Field of the Invention

This invention relates generally to memory devices and more particularly to NOR-type mask ROM (Read Only Memory) devices.

2. Description of the Related Art

To meet demands for ROM devices having higher integration levels, lower cost, and higher speed, designers of mask ROMs have migrated from conventional NOR-type cells to conventional NAND-type cell designs, and back to NOR-type cell designs having a flat structure. A conventional NOR-type cell can be easily realized to achieve high speeds through the use of high cell currents. However, a disadvantage of this approach is that the area of each cell is enlarged, thus increasing the overall size of the semiconductor memory device. Since the area of a NAND-type cell is small, and since each cell has a low cell current, NAND-type cells have been used to achieve high integration levels at the expense of lower speeds.

Recently, NOR-type flat cells ( which do not include field oxidation films for separating units within a cell array) have been developed because they retain the speed advantages of conventional NOR-type cells but can also be miniaturized like the NAND-type cells. NOR-type flat cells have high cell current values, and since NOR-type cells have superior cell uniformity, multi-bit or multi-state concepts can be utilized to store several bits of information within one cell.

The operation of several prior art NOR-type memory cells will be described with reference to FIGS. 1–4 in which components performing similar functions are identified by similar reference designators. Selection transistors designated with the symbol "S" are maintained in the on-state when the power source voltage VCC is applied thereto. "S" election transistor which do not having the reference symbol "S" are maintained in the off-state even when the power source voltage VCC is applied thereto. The reference symbol FOX1 represents a field oxide region for separating units between two bit lines. Also, the regions drawn with diagonal slanting lines represent buried diffusion layers.

The structure of the portion of the memory cell array which includes word lines WL1–WLn is generally the same for the arrays shown in FIGS. 1–4. The differences between the arrays shown in FIGS. 1–4 are generally in the manner in which the current drive ability of the selection transistors are improved in the discharge path from a bit line to a ground line. The cell selection transistors are fabricated using the same design rule as the memory cell array. Thus, when the design rule decreases, the number of the selection transistor connected in series with the path from the bit lines to ground lines should be decreased, the channel width should be increased to improve the cell driving ability, or the resistance of the buried impurity regions should be reduced.

Referring to FIG. 1, main bit line ML2 is located between ground lines ML1 and ML3, and main bit line ML4 is located between ground lines ML3 and ML5. All of the lines are made of metal. Buried N$^+$ impurity diffusion layers form sub-bit lines SBL1–SBL9 which are arranged on a substrate in parallel with the bit and ground lines. Odd numbered ones of the sub-bit lines SBL1–SBL1, such as SBL1, SBL3, SBL5, SBL7 and SBL9, are electrically connected with the main bit lines ML2 and ML4 and the ground lines ML1, ML3 and ML5 through bit line contacts and main bank selection transistors, respectively. Bank selection transistors S are formed at the cross-point in which are bank selection lines BS1 and BS4 intersect with the main bit lines ML1–ML5.

Odd numbered ones SBLi (i=1,3,5 . . . ) of sub-bit lines SBL1–SBL9 are selectively connected with even numbered ones through sub-bank selection transistors, respectively, wherein the sub-bank transistors S are formed at the cross-point in which the sub-bank selection lines BS2 and BS3 intersect with the main bit lines ML1–ML5. The sub-bit lines SBLi (i=1,2,3 . . . ) formed by the buried N$^+$ impurity diffusion layers are used as drain and source therein. Thus, when one of the memory cells is selected, the main bank selection transistors S located at the top and bottom are set to the logic "high" level so that the bank selection line BS1 and BS4 and the sub-bank selection line BS2 and BS3 can be activated therein. Also, when the odd numbered bank selection transistor SBLi is at a logic "high" level, and the even numbered bank selection transistor SBLk is at a logic "low level, the sub-bit lines are electrically connected with each other so that the sub-bit lines positioned adjacent each other are used for as source and drain, and the row of the memory cell array having the channel of a memory cell transistor between the sub-bit lines is selected. Thus, for the above operation, the ground lines NILL, ML3 and ML5 are electrically connected with the sub-bank selection line BS2 and BS3.

Then, when a word line WLi is selected and placed in a logic "high" level, current flows to the ground lines from the main bit lines in accordance with the value of the threshold voltage Vth of the memory cell selected. For example, if the voltage applied to the selected word line WLi is 3 V, the threshold voltage Vth of an on-cell is set to about 0.51–1.5 V, while the threshold voltage Vth of an off-cell should be higher than 3 V . Also, when a nearby column is selected, the biasing voltage applied to the sub-bank selection transistor as stated in the above example should the opposite of that described above.

The cell operation of the device shown in FIG. 2 is similar to that shown in FIG. 1, but there are minor differences in the construction of the main bank selection transistor. First, the main bank selection transistor in FIG. 1 is formed as a conventional transistor where the drain/source is formed by self-alignment ion injection after the formation of a gate rather than as a buried transistor as in FIG. 2. Second, bit lines BL1 and BL2 are separated by field oxide. In addition, the drain is connected to the main bit line BLi through a contact, and the source is formed from a conventional N$^+$ diffusion layer electrically connected to the buried diffusion layer SB1 to SB4 of the memory cell.

In general, the resistance of the buried diffusion layer of the memory cell should correspond to a logic "low" if possible. However, it is very difficult to maintain the density of dose at a given density because of the reduction the channel length and punch through margin by a subsequent heat budget. Hence, the current driving ability of the buried transistors, i.e., the bank selection transistors, deteriorates. Further, because over-etching can occur when the contact hole is formed, a shallow junction in accordance with low density doping of the source/drain causes deterioration of the junction breakdown voltage. Therefore, the main bank selection transistors of the prior art array of FIG. 1 has a superior construction comparing with that of FIG. 2. Furthermore, reduction of doping by the reduction of the design rule at the buried diffusion layer can result in improved performance from that described above.

Referring to FIG. 3, a current path from the bit line to the ground line, which has a ∪ type or a ∩ type (U-type or inverted U-type), is formed by the bank selection transistors located at the top and bottom and makes a transition from the logic low level to the logic high level or from the logic high level to the logic low level. Further, in comparison with the arrays shown in FIGS. 1 and 2, the number of transistor in the current path is reduced, and thus, the cell current is superior. However, a problem with the design shown in FIG. 3 is that the channel width of the bank selection transistors is restricted and the length of the channel is non-uniform. Also, since the main bit lines are connected with one of the sub-bit lines, bit line charging must occur, and this reduces the speed of the device due to the high junction capacitance.

Referring to FIG. 4, the sensing structure of a source line is formed from the buried diffusion layers (drawn with slanted lines) which are connected with the ground lines MG1 to MG5 wherein the ground lines MG1 to MG5 are arranged between sub-bit lines SB1 to SB4 connected to one main bit line MB1.

Accordingly, a need remains for a mask ROM which overcomes the limitations of the prior art.

SUMMARY OF THE INVENTION

Therefore, it is an object of the present invention to improve the drive ability of bank selection transistors in a memory device.

Another object of the present invention is to reduce the effective resistance of a current path between a bank selection transistor and a memory cell in a memory device.

Yet another object of the present invention is reduce the chip area required for bank selection transistors in a semiconductor memory device.

A further object of the present invention is to provide a mask ROM device with bank selection transistor having improved cell current driving ability by reducing scattering in the memory device.

To accomplish these and other objects, a NOR-type mask ROM constructed in accordance with the present invention reduces the resistance ratio of buried diffusion layers and improves the drive capacity of bank selection transistors by utilizing sub-bit line selection transistors located near the center of a memory cell array. The sub-bit line selection transistors are connected to a pair of sub-bank selection lines that divide the memory cell array into symmetric upper and lower portions. The bank selection transistors couple alternate sub-bit lines to main bit lines at both ends of the sub-bit lines, thereby forming a dual current path between the main bit lines and the memory cells coupled to the sub-bit lines.

One aspect of the present invention is a semiconductor memory array comprising: a plurality of main bit lines extending across the array in a first direction; a plurality of first buried doped regions arranged proximate a first side of the memory array, wherein each of the first doped regions is electrically connected to one of the main bit lines through a bit line contact; a plurality of second buried doped regions arranged proximate a second side of the memory array opposite the first side, wherein each of the second doped regions corresponds to one of the first doped regions and is electrically connected to the same main bit line as the corresponding first doped region through a bit line contact; a plurality of third buried doped regions for use as sub-bit lines extending in the first direction, wherein each of the third doped regions corresponds to one of the first doped regions and its corresponding second doped region, and wherein each third doped region is disposed between, and electrically isolated from, the corresponding first and second doped regions; a plurality of fourth buried doped regions for use as sub-bit lines extending in the first direction and interleaved with the third doped regions and the corresponding first and second doped regions; a plurality of memory cells, wherein each memory cell is disposed between one of the third doped regions and one of the fourth doped regions such that the third and fourth doped regions function as sources and drains for the memory cells; a plurality of word lines extending in a second direction across the third and fourth doped regions for selectively accessing the memory cell; a plurality of first main bank selection transistors, each first main bank selection transistor coupled between one of the first doped regions and one of the fourth doped regions; a plurality of second main bank selection transistors, each second main bank selection transistor coupled between one of the second doped regions and one of the fourth doped regions; a first main bank selection line extending in the second direction across the first and fourth doped regions for controlling the plurality of first main bank selection transistors; and a second main bank selection line extending in the second direction across the second and fourth doped regions for controlling the plurality of second main bank selection transistors.

The memory device can further include: a plurality of first sub-bank selection transistors located proximate a center line of the memory array, each first sub-bank selection transistor coupled between one of the third doped regions and one of the fourth doped regions located adjacent a first side of the third doped region; a plurality of second sub bank selection transistors located proximate the center line of the memory array, each second sub bank selection transistor coupled between one of the third doped regions and one of the fourth doped regions located adjacent a second side of the third doped region; a first sub-bank selection line extending in the second direction across the third and fourth doped regions for controlling the plurality of first sub bank selection transistors; and a second sub-bank selection line extending in the second direction across the third and fourth doped regions for controlling the plurality of second sub bank selection transistors.

Another aspect of the present invention is a semiconductor memory device comprising: a main bit line; a first sub-bit line; a plurality of memory cells coupled to the first sub-bit line; a first switch disposed between the main bit line and the first sub-bit line at a first position along the first sub-bit line; and a second switch disposed between the main bit line and the first sub-bit line at a second position along the first sub-bit line; whereby the first and second switches form a dual current path for current flowing between the main bit line and the memory cells through the first sub-bit line.

The device can further include: a second sub-bit line arranged parallel to the first sub-bit line and coupled to the plurality of memory cells; and a third switch coupled between the first and second sub-bit lines at a third position along the first sub-bit line intermediate the first and second positions. The third position is preferably about midway between the first and second positions.

A further aspect of the present invention is a semiconductor memory device comprising: a first sub-bit line having a center portion; a second sub-bit line having a center portion and arranged parallel to the first sub-bit line; a plurality of memory cells coupled between the first and second sub-bit lines; and a sub-bit line selection switch coupled between the first and second sub-bit lines at the center portions of the first and second sub-bit lines. The device can further include: a third sub-bit line having a center portion; and a second sub-bit line selection switch coupled between the second and third sub-bit lines at the center portions of the second and third sub-bit lines.

An advantage of the present invention is that it improves the drive capability of a bank selection transistor while keeping the chip area where the bank selection transistor is located small.

Another advantage of the present invention is that the resistance ration a buried impurity layer can be reduced.

The foregoing and other objects, features and advantages of the invention will become more readily apparent from the following detailed description of a preferred embodiment of the invention which proceeds with reference to the accompanying drawings.

DETAILED DESCRIPTION

Figure 1:
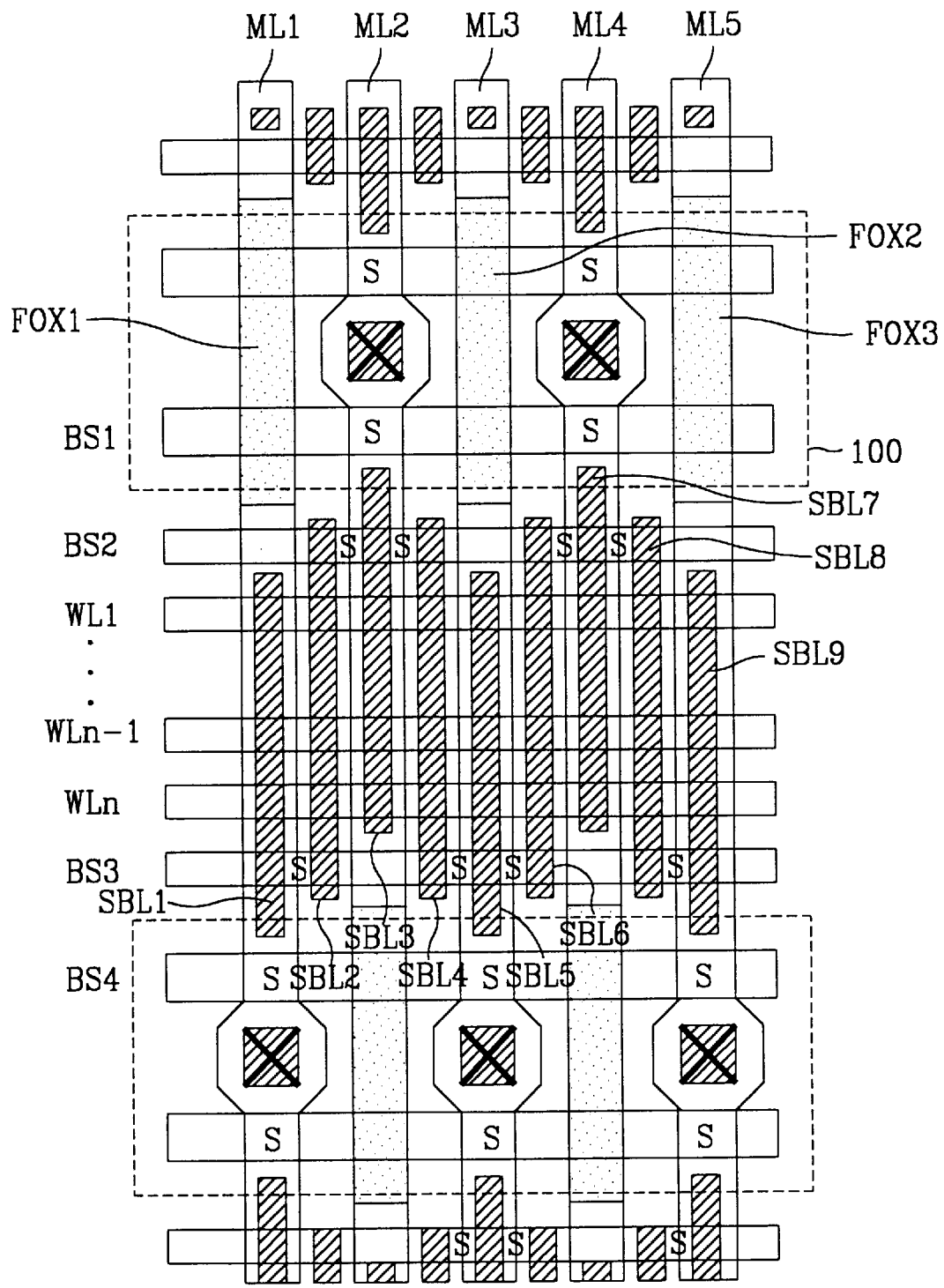
FIG. 1 is a drawing showing the layout of a first prior art NOR-type mask ROM device.
Figure 2:
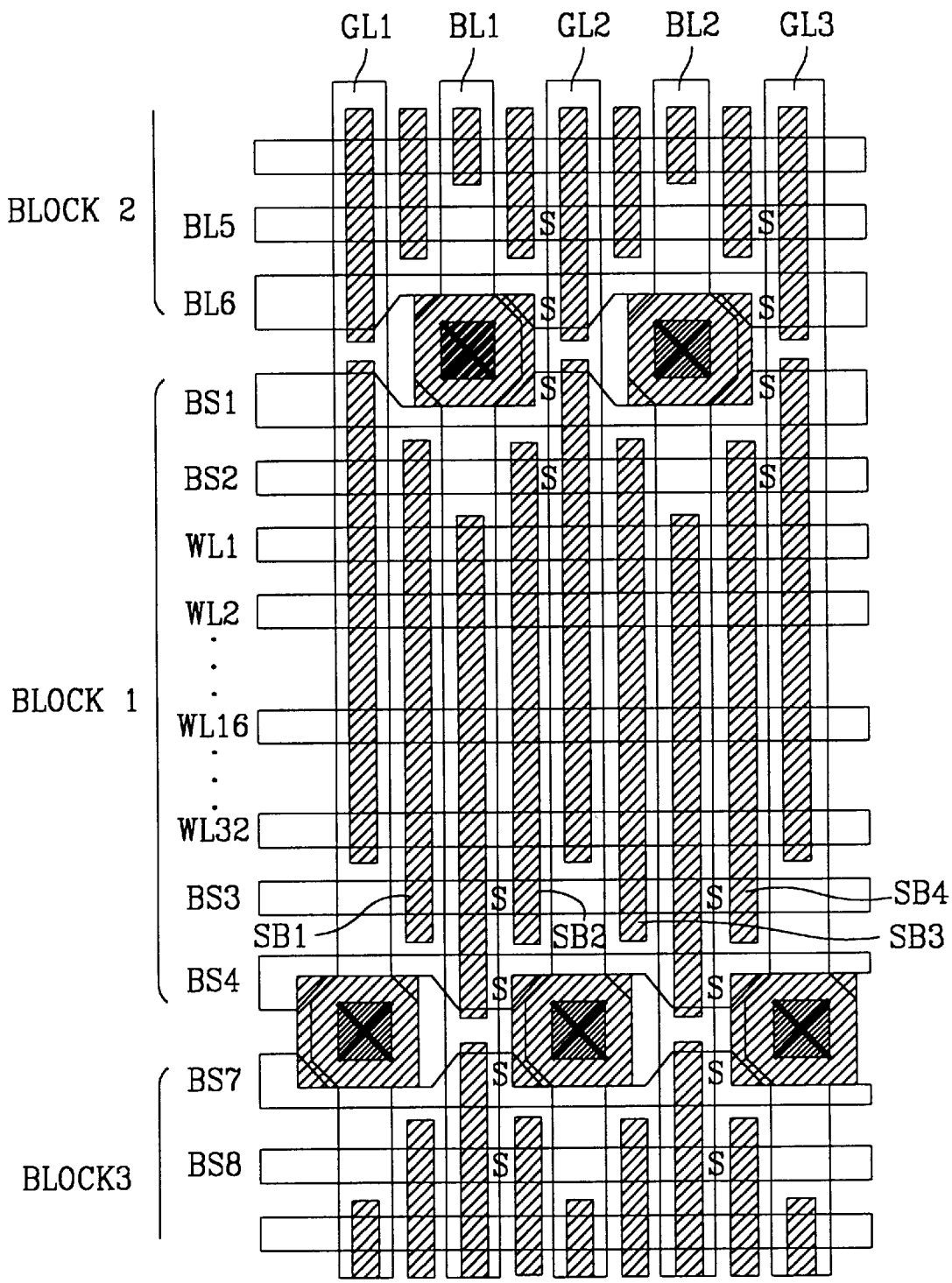
FIG. 2 is a drawing showing the layout of a second prior art NOR-type mask ROM device.
Figure 3:
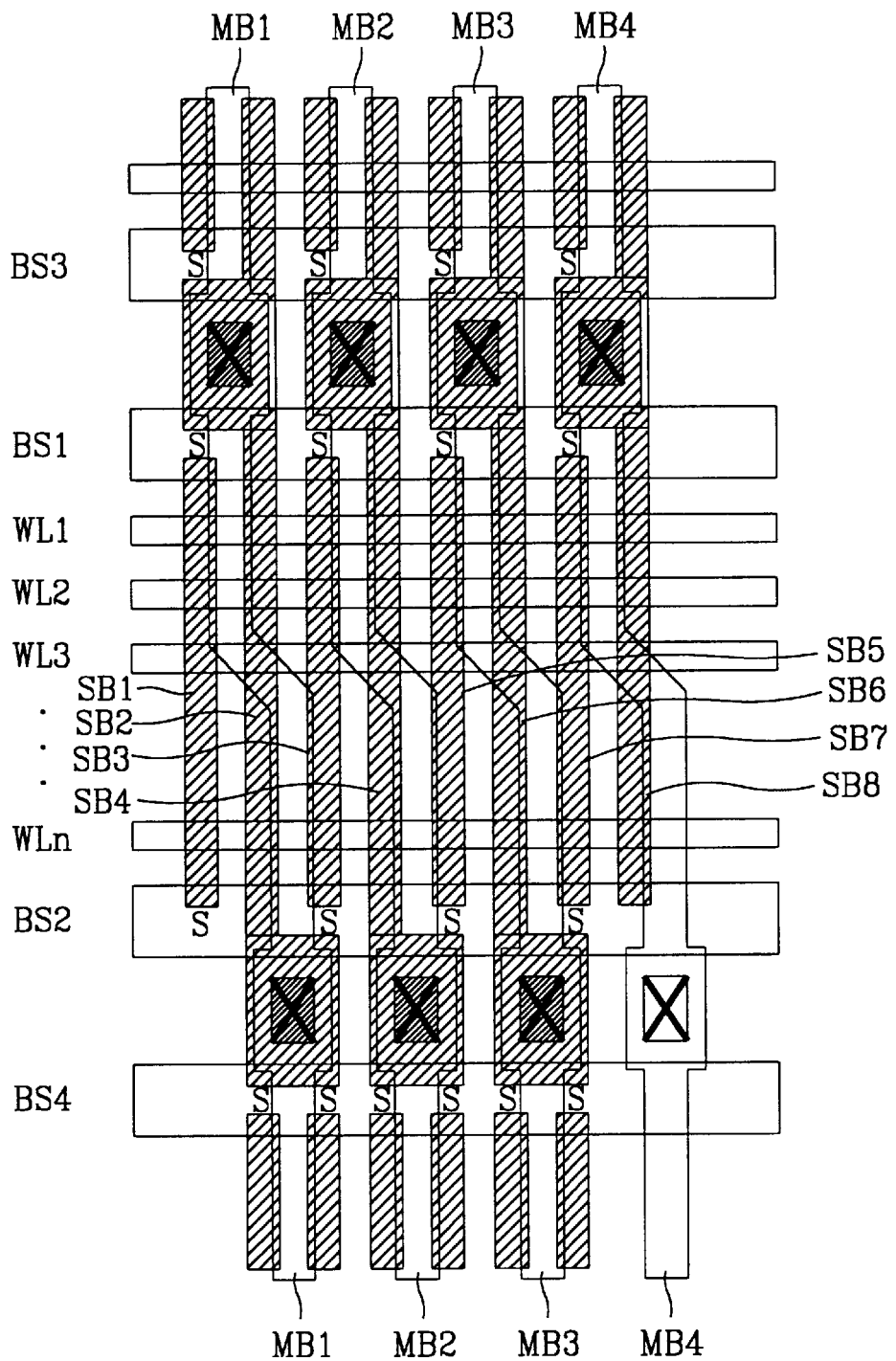
FIG. 3 is a drawing showing the layout of a third prior art NOR-type mask ROM device.
Figure 4:
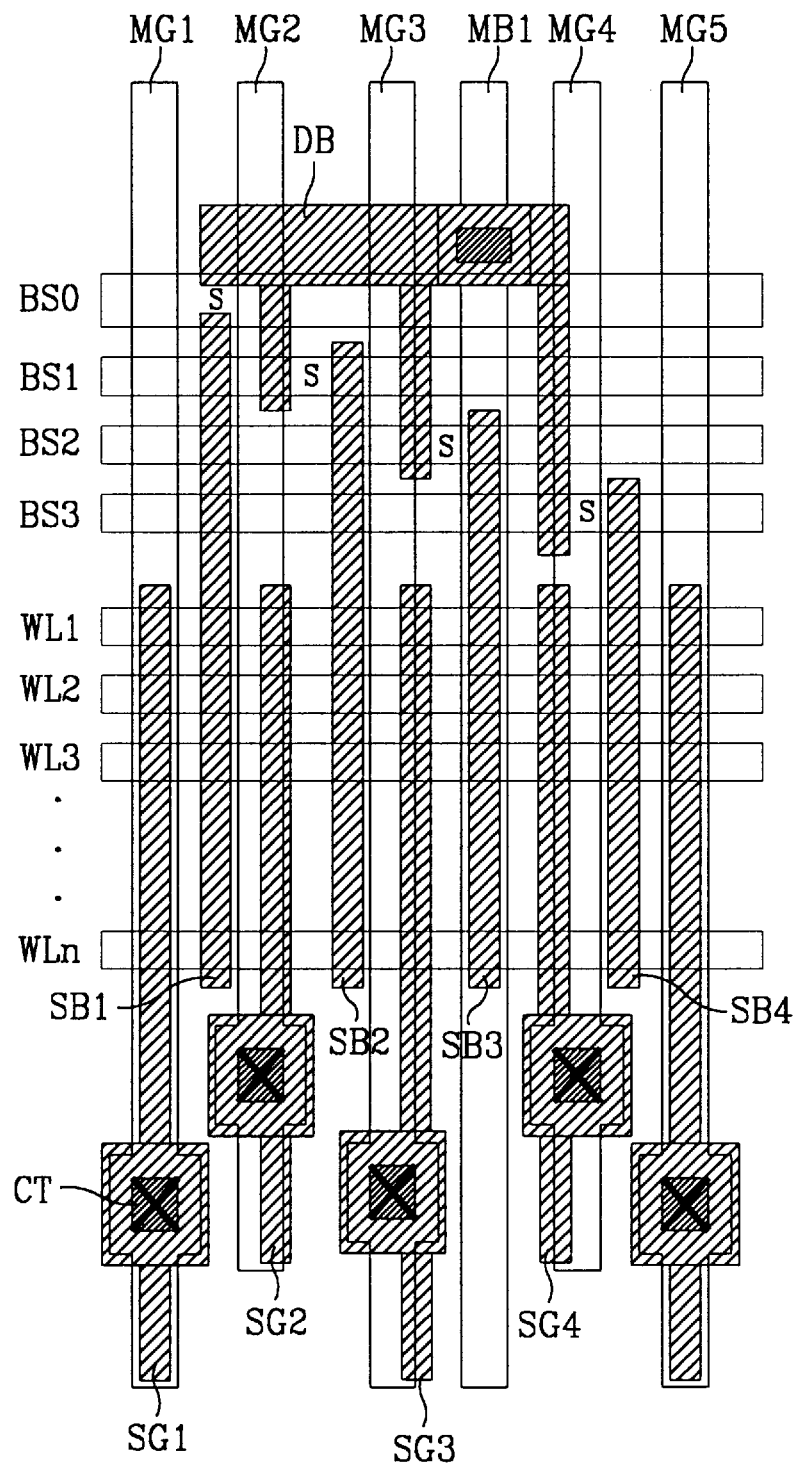
FIG. 4 is a drawing showing the layout of a fourth prior art NOR-type mask ROM device.
Figure 5:
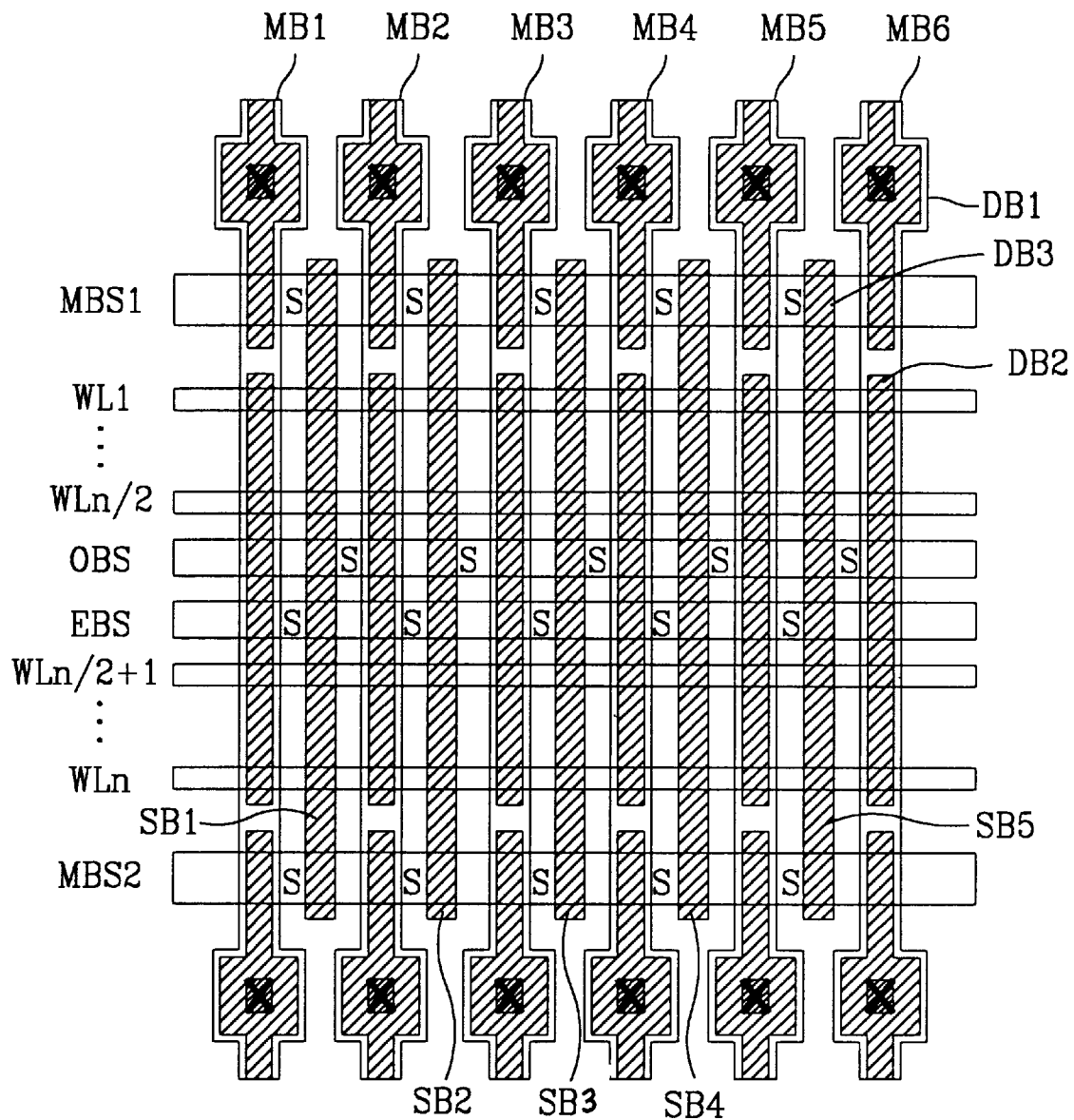
FIG. 5 is a top-view showing the layout of an embodiment of a NOR-type mask ROM device in accordance with the present invention.

FIG. 5 is a top view illustrating a layout of a first embodiment of a NOR-TYPE Mask ROM according to the present invention. Referring to FIG. 5, main bit lines and ground lines MBi (i=1 to 6) are arranged in an alternating pattern. Each of the main bit lines MBi and the ground lines are electrically connected to one of a plurality of first buried diffusion layers DB1, which are formed in parallel thereto and extend along the lines thereof, through a bit line contact. A plurality of second buried diffusion layers DB2 are formed as sub-bit lines SBi, and are electrically separated from the plurality of first buried diffusion layers DB1. A plurality of third buried diffusion layers DB3 are formed as another set of sub-bit lines SB+1 between the main bit lines MBi and in parallel with the first buried diffusion layers DB1 and the second buried diffusion layers DB2.

Main bank selection lines MBSi, which drive the main bank selection transistors, are symmetrically formed at both terminals of the third buried diffusion layers DB3 such that the first buried diffusion layers DB1 and the third buried diffusion layers DB3 function as source/drain for the bank selection transistors. The second buried diffusion layers DB2 are formed between the third buried diffusion layers DB3, where the second buried diffusion layers DB2 are in parallel with, and aligned with, the first buried diffusion layers DB1 and electrically separated from the first buried diffusion layers DB1. The third buried diffusion layers DB3 and the second buried diffusion layer DB2 extend in parallel with each other and function as source/drain for the memory cell arrays.

Sub-bank selection lines pairs OBS and EBS, which drive buried sub-bank selection transistors for selectively connecting the second buried diffusion layers DB2 to the adjacent third buried diffusion layers DB3, are formed at the center of the memory cell array. The gates of the memory cells are controlled by word lines WL1 to WLn which extended in the vertical direction, i.e. column direction.

The memory cell array of FIG. 5 has a symmetrical structure in that the memory cell array is divided into top and bottom portions by the sub-bank selection lines which are aligned with a center line of the array.

Selection transistors designated with an "S" are programmed with a threshold voltage Vth indicative of an on-cell of by ion injection. "S" election transistors not designated with an "S" are programmed with a threshold voltage Vth indicative of an off -cell.

Figure 6:
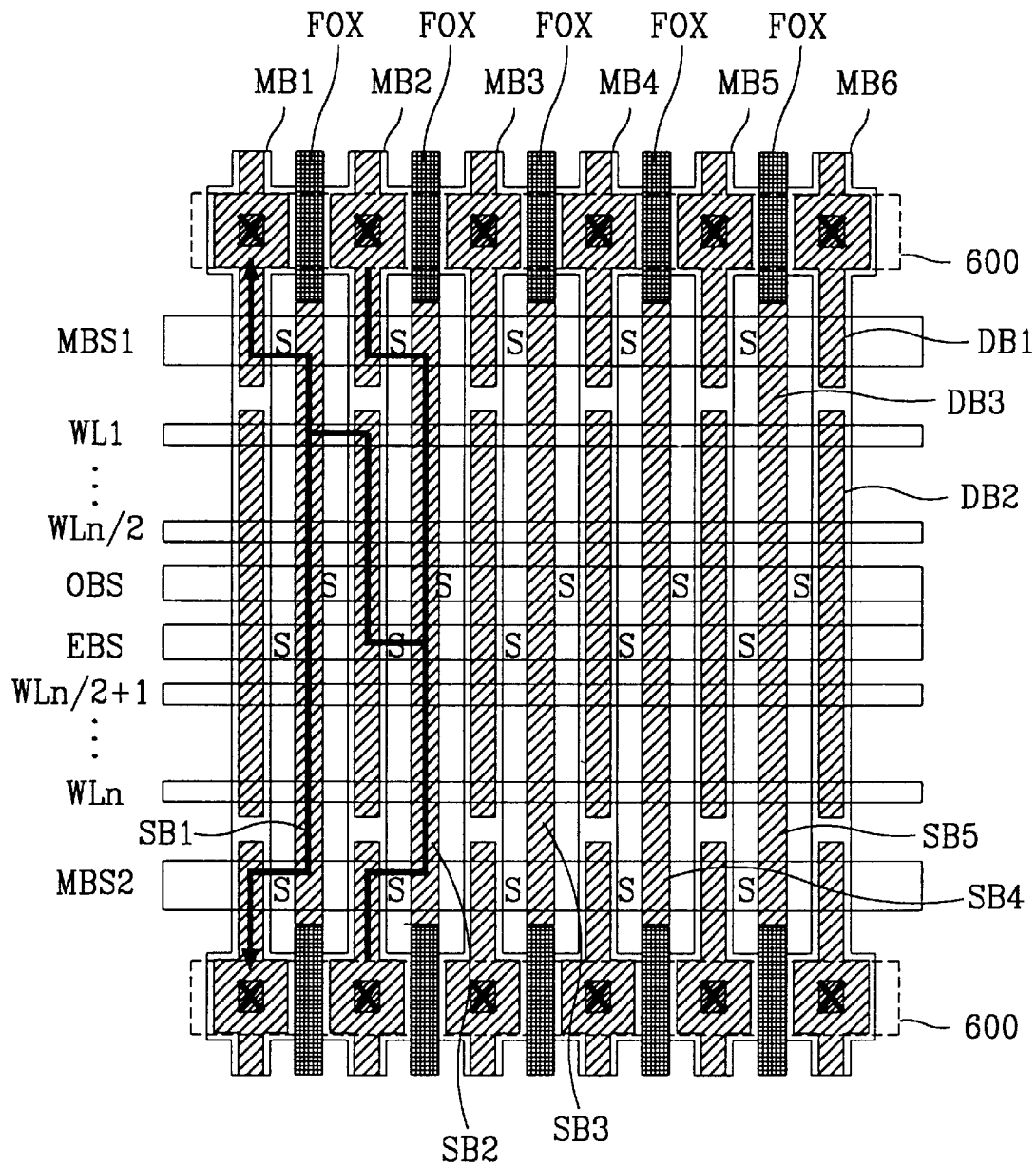
FIG. 6 is a top-view showing the layout of a second embodiment of a NOR-type mask ROM device in accordance with the present invention.

FIG. 6 is a top view illustrating a layout of a second embodiment of a NOR-type mask ROM in accordance with the present invention. The array of FIG. 6 is similar to that of FIG. 5, but there is a field oxide region disposed between the bit line contacts. This reduces the deterioration of the brake-down voltage of the contact by the shallow junction of the buried $N^+$ impurity diffusion layer and the unit separation of the high density $N^+$ impurity diffusion layer.

In operation, a logic "high" level is applied to the main bank selection lines MBS1 and MBS2 of the bank selected. Also, the voltage of the main bit line MB2 and the ground lines selected through the main bank located at the top and bottom are respectively applied to the sub-bit line SB2 composed of the third buried diffusion layer DB3. Then, one of the two columns located nearby is selected by the application of a logic"high" level to one of the sub-bank selection OBS and EBS. A logic "high" level is applied to the selected word line WLi, while a logic "low" level is applied to the remaining word lines WLi which are not selected so that current flowing to the ground line from the main bit line MB2 can be detected and the state of the selected memory cell can be determined. In general, when the power source voltage VCC is set to 3 V to 3.5 V, the threshold voltage Vth of on-cells must be set to 0.6 V to 4.0 V, while 4.0 V is a suitable threshold voltage Vth for off-cells.

The present invention has several advantages over prior art memory cell array designs. First, a dual path is formed for connecting the sub-bit line SB2 and the main bit line MB2 and the ground lines as shown by the solid line in FIG. 6. Thus, the resistance ratio of the conventional buried $N^+$ impurity diffusion layer is reduced. This is very important because, with the present invention, the dose of the buried $N^+$ impurity diffusion layer does not have to be increased when the design rule is reduced for achieving higher integration levels.

Second, since a dual current path is formed, the regular resistance of the source and drain can be maintained, thereby improving the uniformity of the memory cells.

Third, the channel width of the bank selection transistors can be made as large as desired.

Fourth, since the area where the bank selection transistor is located is a small portion of the memory cell array compared with the prior art, an effective cell structure can be designed even though the width of the channel is increased.

As described above, the present invention provides an advantage in that the current driving ability of the bank selection transistors can be increased within the memory cell array, and scattering of current in the semiconductor memory device is reduced.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A NOR type mask ROM, comprising:
a plurality of main bit lines extending in a first direction in parallel with each other;
a plurality of first buried diffusion layers arranged in parallel with said main bit lines and connected to the bit lines through bit line contacts;
a plurality of second buried diffusion layers arranged in parallel with said main bit lines and electrically separated from said first buried diffusion layers for use as first sub-bit lines;
a plurality of third buried diffusion layers arranged in parallel with said main bit lines and positioned between said main bit lines for use as second sub-bit lines;
a plurality of word lines extending in a second direction across said second and third buried diffusion layers and formed with gate dielectric films between the word lines and said second and third buried diffusion layers;
a plurality of bank selection lines extending in the second direction across said first and third buried diffusion layers to form bank selection transistors for selectively connecting said first buried diffusion layers and said third buried diffusion layers, wherein said first buried diffusion layers and said third buried diffusion layers function as drains and sources;
a memory cell array having a plurality of memory cells wherein said second and third buried diffusion layers function as sources and drains and said word lines function as gates; and
a pair of sub-bank selection lines arranged proximate the center of said memory cell array and extending in the second direction across said second and third buried diffusion layers to form sub-bank selection transistors for selectively connecting said second and third buried diffusion layers, thereby selecting said memory cells.

2. A NOR type mask ROM as recited in claim 1 further comprising a field oxide unit arranged between said bit line contacts.

3. A NOR type mask ROM as recited in claim 2 further comprising an impurity area which is formed in part at said bit line contacts by said field oxide.

4. A NOR type mask ROM as recited in claim 1 wherein said main bit lines are made of metal.

5. A NOR type mask ROM as recited in claim 1 wherein said memory cell array includes an upper portion and a lower portion, wherein said upper and lower portions are arranged symmetrically and centered about said pair of sub-bank selection lines.

6. A semiconductor memory array comprising:
a plurality of main bit lines extending across the array in a first direction;
a plurality of first buried doped regions arranged proximate a first side of the memory array, wherein each of the first doped regions is electrically connected to one of the main bit lines through a bit line contact;
a plurality of second buried doped regions arranged proximate a second side of the memory array opposite the first side, wherein each of the second doped regions corresponds to one of the first doped regions and is electrically connected to the same main bit line as the corresponding first doped region through a bit line contact;
a plurality of third buried doped regions for use as sub-bit lines extending in the first direction, wherein each of the third doped regions corresponds to one of the first doped regions and its corresponding second doped region, and wherein each third doped region is disposed between, and electrically isolated from, the corresponding first and second doped regions;
a plurality of fourth buried doped regions for use as sub-bit lines extending in the first direction and interleaved with the third doped regions and the corresponding first and second doped regions;
a plurality of memory cells, wherein each memory cell is disposed between one of the third doped regions and one of the fourth doped regions such that the third and fourth doped regions function as sources and drains for the memory cells;
a plurality of word lines extending in a second direction across the third and fourth doped regions for selectively accessing the memory cell;
a plurality of first main bank selection transistors, each first main bank selection transistor coupled between one of the first doped regions and one of the fourth doped regions;
a plurality of second main bank selection transistors, each second main bank selection transistor coupled between one of the second doped regions and one of the fourth doped regions;
a first main bank selection line extending in the second direction across the first and fourth doped regions for controlling the plurality of first main bank selection transistors; and
a second main bank selection line extending in the second direction across the second and fourth doped regions for controlling the plurality of second main bank selection transistors.

7. A memory device according to claim 6 further including:
a plurality of first sub-bank selection transistors located proximate a center line of the memory array, each first sub-bank selection transistor coupled between one of the third doped regions and one of the fourth doped regions located adjacent a first side of the third doped region;
a plurality of second sub-bank selection transistors located proximate the center line of the memory array, each second sub-bank selection transistor coupled between one of the third doped regions and one of the fourth doped regions located adjacent a second side of the third doped region;
a first sub-bank selection line extending in the second direction across the third and fourth doped regions for controlling the plurality of first sub-bank selection transistors; and
a second sub-bank selection line extending in the second direction across the third and fourth doped regions for controlling the plurality of second sub-bank selection transistors.

8. A memory device according to claim 6 wherein the buried doped regions are buried diffusion regions.

9. A memory device according to claim 6 wherein the memory device is a ROM device and the memory cells are programmed by ion injection.

10. A memory device according to claim 6 wherein each first main bank selection transistor is disposed between one of the first doped regions and one of the fourth doped regions such that the first and fourth doped regions function as sources and drains for each of the first main bank selection transistors.

11. A memory device according to claim 6 wherein each second main bank selection transistor is disposed between one of the second doped regions and one of the fourth doped regions such that the second and fourth doped regions function as sources and drains for each of the second main bank selection transistors.

12. A memory device according to claim 6 wherein:
   each second main bank selection transistor corresponds to one of the first main bank selection transistors;
   each first main bank selection transistor couples one of the fourth doped regions to an adjacent one of the first doped regions; and
   the corresponding second main bank selection transistor couples said fourth doped regions to the second doped region that corresponds to said adjacent first doped region.

13. A memory device according to claim 7 wherein each first sub-bank selection transistor is arranged between said third doped region and said fourth doped region such that said third and fourth doped regions function as source and drain for the first sub-bank selection transistor.

14. A memory device according to claim 7 wherein each second sub-bank selection transistor is arranged between said third doped region and said fourth doped region such that said third and fourth doped regions function as source and drain for the second sub bank selection transistor.

15. A memory device according to claim 6 further including a plurality of field oxide regions disposed between the bit line contacts.

16. A semiconductor memory device comprising:
   a main bit line;
   a first sub-bit line;
   a plurality of memory cells coupled to the first sub-bit line;
   a first switch disposed between the main bit line and the first sub-bit line at a first position along the first sub-bit line; and
   a second switch disposed between the main bit line and the first sub-bit line at a second position along the first sub-bit line;
   whereby the first and second switches form a dual current path for current flowing between the main bit line and the memory cells through the first sub-bit line.

17. A memory device according to claim 16 further including:
   a second sub-bit line arranged parallel to the first sub-bit line and coupled to the plurality of memory cells; and
   a third switch coupled between the first and second sub-bit lines at a third position along the first sub-bit line intermediate the first and second positions.

18. A memory device according to claim 17 wherein the third position is about midway between the first and second positions.

19. A semiconductor memory device comprising:
   a first sub-bit line having a center portion;
   a second sub-bit line having a center portion and arranged parallel to the first sub-bit line;
   a plurality of memory cells coupled between the first and second sub-bit lines; and
   a sub-bit line selection switch coupled between the first and second sub-bit lines at the center portions of the first and second sub-bit lines.

20. A memory device according to claim 19 further including:
   a third sub-bit line having a center portion; and
   a second sub-bit line selection switch coupled between the second and third sub-bit lines at the center portions of the send and third sub-bit lines.

* * * * *

UNITED STATES PATENT AND TRADEMARK OFFICE
CERTIFICATE OF CORRECTION

PATENT NO.    : 5,923,606
DATED         : July 13, 1999
INVENTOR(S)   : Lee et al.

It is certified that error appears in the above-identified patent and that said Letters Patent is hereby corrected as shown below:

Column 2,
Line 2, "SBL1-SBL1" should read -- SBL1-SBL9 --.
Line 30, "NILL" should read -- ML1 --.
Line 38, "0.51" should read -- 0.5 --.

Column 6,
Line 14, "S"election" should read -- Selection --.
Line 41, "0.6V to 4.0V" should read -- 0.6V to 1.0V --.

Signed and Sealed this

Nineteenth Day of November, 2002

Attest:

Attesting Officer

JAMES E. ROGAN
Director of the United States Patent and Trademark Office